(12) United States Patent
Hoffman et al.

(10) Patent No.: US 7,462,862 B2
(45) Date of Patent: Dec. 9, 2008

(54) TRANSISTOR USING AN ISOVALENT SEMICONDUCTOR OXIDE AS THE ACTIVE CHANNEL LAYER

(75) Inventors: Randy L. Hoffman, Corvallis, OR (US); Gregory S. Herman, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 43 days.

(21) Appl. No.: 11/257,935

(22) Filed: Oct. 25, 2005

(65) Prior Publication Data

US 2006/0043377 A1    Mar. 2, 2006

Related U.S. Application Data

(63) Continuation-in-part of application No. 10/799,318, filed on Mar. 12, 2004, now Pat. No. 7,282,782.

(51) Int. Cl.
*H01L 29/786* (2006.01)
(52) U.S. Cl. ............................. 257/43; 257/20; 257/22; 257/E29.299
(58) Field of Classification Search .................... 257/20, 257/22, 43, E29.299
See application file for complete search history.

(56) References Cited

U.S. PATENT DOCUMENTS

| | | | |
|---|---|---|---|
| 4,887,255 | A | 12/1989 | Handa et al. |
| 5,744,864 | A | 4/1998 | Cillessen et al. |
| 6,225,655 | B1 | 5/2001 | Moise et al. |
| 6,255,130 | B1 | 7/2001 | Kim |
| 6,362,499 | B1 | 3/2002 | Moise et al. |
| 6,563,174 | B2 | 5/2003 | Kawasaki et al. |
| 6,864,507 | B2 * | 3/2005 | Yokogawa et al. ............. 257/77 |
| 2002/0153587 | A1 | 10/2002 | Adkisson et al. |
| 2003/0013261 | A1 | 1/2003 | Asano |
| 2003/0047785 | A1 * | 3/2003 | Kawasaki et al. ........... 257/350 |
| 2003/0111663 | A1 | 6/2003 | Yagi |
| 2003/0207502 | A1 | 11/2003 | Yamazaki et al. |
| 2003/0218221 | A1 | 11/2003 | Wager et al. |
| 2003/0218222 | A1 | 11/2003 | Wager et al. |
| 2003/0219530 | A1 | 11/2003 | Yamazaki et al. |
| 2007/0194379 | A1 | 8/2007 | Hosono et al. |

FOREIGN PATENT DOCUMENTS

| | | |
|---|---|---|
| EP | 1134811 | 9/2001 |
| EP | 1172858 | 1/2002 |
| EP | 1209748 | 5/2002 |
| WO | WO97/06544 | 2/1997 |
| WO | WO 03040441 A1 * | 5/2003 |

OTHER PUBLICATIONS

U.S. Appl. No. 10/763,353, filed Jan. 23, 2004, Hoffman.
U.S. Appl. No. 10/763,354, filed Jan. 23, 2004, Hoffman.
U.S. Appl. No. 60/490,239, filed Jul. 25, 2003, Hoffman.
Aoki, Akira et al., "Tin Oxide Thin Film Transistors," Japan J. Appl. Phys., vol. 9, p. 582 (1970).

(Continued)

*Primary Examiner*—Marcos D. Pizarro (57) ABSTRACT

A semiconductor device can include a channel including an oxide comprising a combination of isovalent cations selected from within the D block and the P block of the Periodic Table.

30 Claims, 7 Drawing Sheets

OTHER PUBLICATIONS

Carcia, P.F., et al., "ZnO Thin Film Transistors for Flexible Electronics," Mat. Res. Soc. Symp. Proc., vol. 769, pp. H72.1-H72.6 (2003).

Fu, Shelton, et al., "MOS and MOSFET with Transition Metal Oxides," SPIE vol. 2697, pp. 620-527.

Giesbers, JB., et al., "Dry Etching of All-Oxide Transparent Thin Film Memory Transistors," Microelectronic Engineering, vol. 35, pp. 71-74 (1997).

Grosse-Holz, K.O., et al., "Semiconductive Behavior of Sb Doped $SnO_2$ Thin Films," Mat. Res. Soc. Symp. Proc., vol. 401, pp. 67-72 (1996).

Hoffman, R.L., et al., "ZnO-based Transparent Thin-Film Transistors," Appl Physics Letters, vol. 82, No. 5, pp. 733-735 (Feb. 3, 2003).

Masuda, Satoshi, et al., "Transparent Thin Film Transistors using ZnO as an Active Channel Layer and Their Electrical Properties," Journal of Applied Physics, vol. 93, No. 3, pp. 1624-1630 (Feb. 1, 2003).

Pallecchi, Giuseppe, et al., "$SrTiO_3$-Based Metal-Insulator Heterostructures," Appl Phys. Lett., vol. 78, No. 15, pp. 2244-2246 (Apr. 9, 2001).

Seager, C.H., et al., "Charge Trapping and Device Behavior in Ferroelectric Memories," Appl. Phys. Lett., vol. 68, No. 19, pp. 2660-2662 (May 6, 1996).

Ueno, K., et al., "Field-Effect Transistor on $SrTiO_3$ with Sputtered $Al_2O_3$ Gate Insulator," Appl. Phys. Lett., vol. 83, No. 9, pp. 1755-1757 (Sep. 1, 2003).

Yoshida, A., "Three Terminal Field Effet Superconducting Device Using $SrTiO_3$ Channel," IEEE Transactions on Applied Superconductivity, vol. 5, No. 2, pp. 2892-2895 (Jun. 1995).

Solid-State Electronics, vol. 7, Pergamon Press, Notes. pp. 701-702 (1964).

Carcia, P.F., et al., "Transparent ZnO Thin-Film Transistor Fabricated by rf Magnetron Sputtering," Appl. Phys. Lett., vol. 82, No. 7, pp. 1117-1119 (Feb. 7, 2003).

Nishi, Junya, et al., "High Mobility Thin Film Transistors with Transparent ZnO Channels," Jpn. J. Appl. Phys., vol. 42, Part 2, No. 4A, pp. L347-L345 (Apr. 2003).

Ohya, Yutaka, et al., "Thin Film Transistor of ZnO Fabricated by Chemical Solution Deposition," Jpn. J. Appl. Phys., vol. 40, Part 1, No. 1, pp. 297-298 (Jan. 2001).

Prins, M.W.J., et al., A Ferroelectric Transparent Thin-Film Transistor, Appl. Phys. Lett., vol. 68, No. 25, pp. 3650-3652 (Jun. 17, 1996).

Wollensteien, Jurgen, et al., "An Insulateed Gate Thin-Film Transistor Using $SnO_2$ as Semiconducting Channel, a Possible New Gas Sensor Device," The 11th European Conference on Solid State Transducers, pp. 471-474 (Sep. 21-24, 1997).

Anonymous, "Transparent and/or Memory Thin Film Transistors in LDCs and PLEADs," Research Disclosure, p. 890 (Jul. 1998).

Minami, Tadatsugu, "Transparent and Conductive Multicomponent Oxide Films Prepared by Magnetron Sputtering," J. Vac. Sci. Technol. A, vol. 17, No. 4, pp. 1765-1772 (Jul./Aug. 1999).

Surplice, N.A., "The Electrical Conductivity of Calcium and Strontium Oxides," Brit. J. Appl. Phys., vol. 17, pp. 175-180 (1966).

Pantelides, Sokrates T., et al., "Electronic Structure and Properties of Magnesium Oxide," Phys. Rev. B., vol. 10, No. 12, pp. 5203-5212 (Dec. 15, 1974).

* cited by examiner

TRANSISTOR USING AN ISOVALENT SEMICONDUCTOR OXIDE AS THE ACTIVE CHANNEL LAYER

CROSS-REFERENCE TO RELATED APPLICATION

The present application is a continuation-in-part application claiming priority under 37 U.S.C. § 120 from U.S. patent application Ser. No. 10/799,318 filed on Mar. 12, 2004, by Randy L. Hoffman, Peter P. Mardilovich and Gregory S. Herman, and entitled "Semi-conductor Device," the full disclosure of which is hereby incorporated by reference.

BACKGROUND

Semiconductor devices are used in a variety of electronic devices. For example, thin-film transistor technology can be used in liquid crystal display (LCD) screens. Some types of thin-film transistors have relatively slow switching speeds because of low carrier mobility. In some applications, such as LCD screens, use of thin-film transistors with relatively slow switching speeds can make it difficult to accurately render motion.

DETAILED DESCRIPTION OF EXAMPLE EMBODIMENTS

The exemplary embodiments of the present disclosure include semiconductor devices, such as transistors, that contain multicomponent oxide semiconductors. Additionally, exemplary embodiments of the disclosure account for the properties possessed by semiconductor devices, such as transistors, that contain multicomponent oxide semiconductors, e.g. optical transparency, chemical stability, mechanical properties, and electrical performance. Exemplary embodiments include semiconductor devices having a channel that includes MgO and CdO. Exemplary embodiments include thin-film transistors having multicomponent oxide semiconductors that contain at least a first binary oxide and a second binary oxide selected from one of a first group, a second group, and a third group of binary metal oxides having an atomic composition first metal (A): second metal (B) ratio (A:B) where A and B are each different and each in a range of about 0.05 to about 0.95 to form an isovalent semiconductor. In some of the exemplary embodiments, the isovalent semiconductor can include an amorphous form, a single-phase crystalline form, or a mixed-phase crystalline form.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It should be understood that the various semiconductor devices may be employed in connection with the various embodiments of the present disclosure, i.e., field effect transistors including thin-film transistors, active matrix displays, logic inverters, and amplifiers. FIGS. 1A-1F illustrate exemplary thin-film transistor embodiments. The thin-film transistors can be of any type, including but not limited to, horizontal, vertical, coplanar electrode, staggered electrode, top-gate, bottom-gate, single-gate, and double-gate, to name a few.

As used herein, a coplanar electrode configuration is intended to mean a transistor structure where the source and drain electrodes are positioned on the same side of the channel as the gate electrode. A staggered electrode configuration is intended to mean a transistor structure where the source and drain electrodes are positioned on the opposite side of the channel as the gate electrode.

Figure 1A:
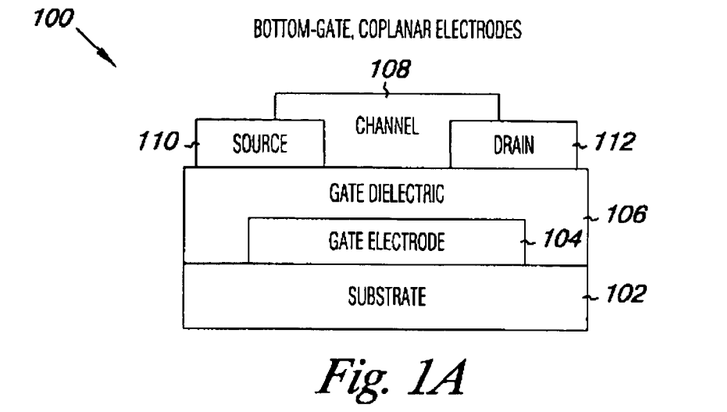
FIGS. 1A-1F illustrate various embodiments of a semiconductor device, such as a thin-film transistor according to an example embodiment.
Figure 1B:
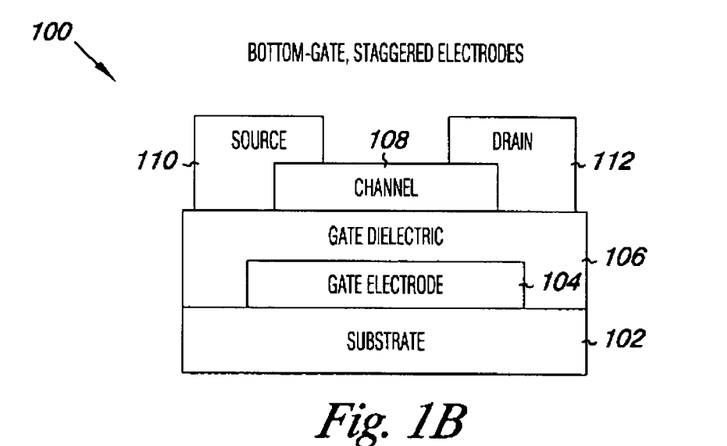
Figure 1C:
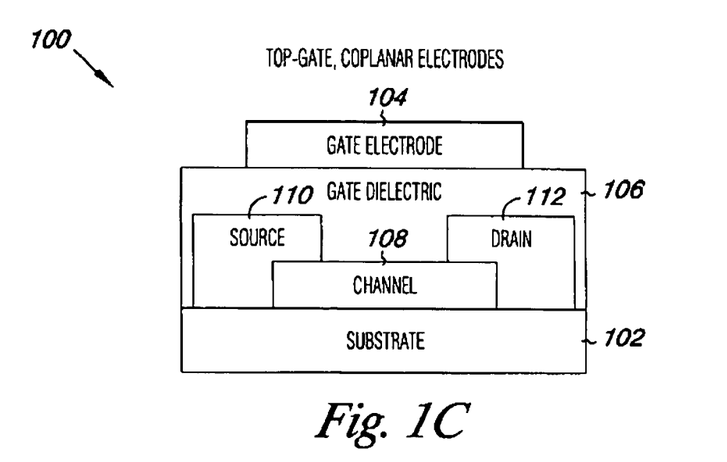
Figure 1D:
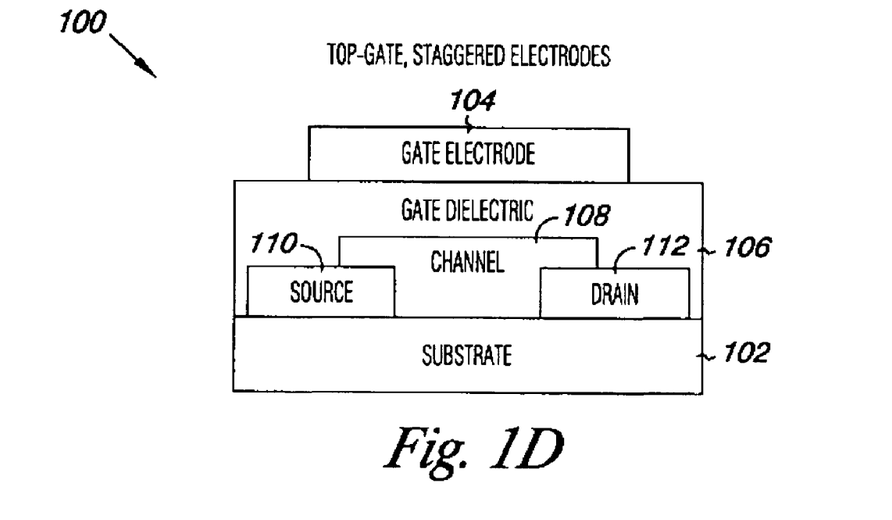
Figure 1E:
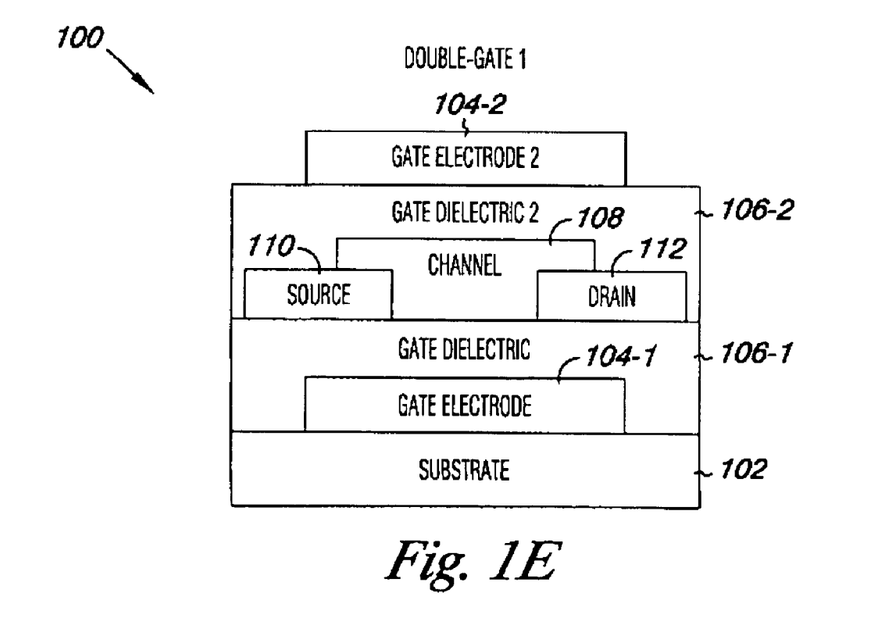
Figure 1F:
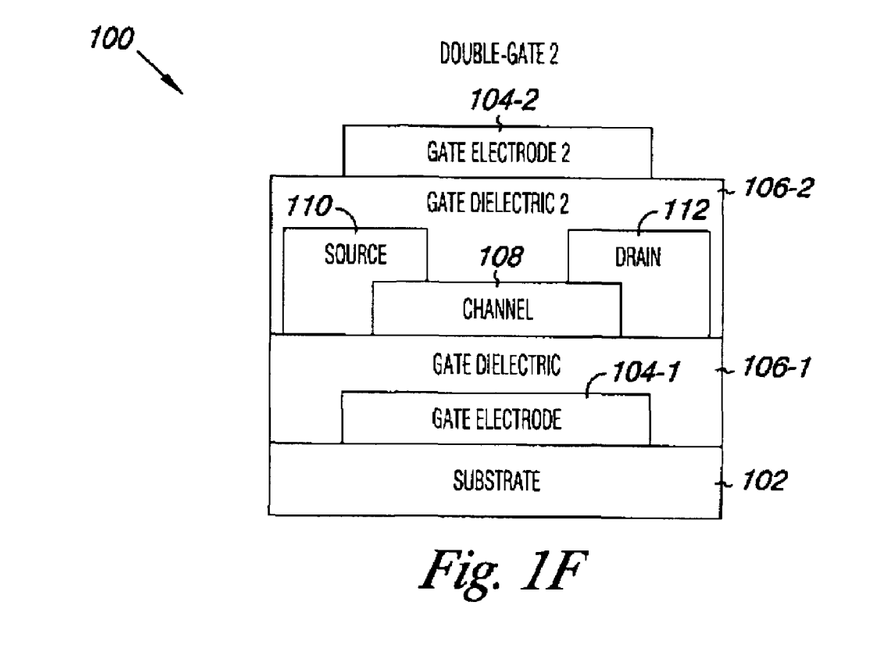

FIGS. 1A and 1B illustrate embodiments of bottom-gate transistors, FIGS. 1C and 1D illustrate embodiments of top-gate transistors, and FIGS. 1E and 1F illustrate embodiments of double-gate transistors. In each of FIGS. 1A-1D, the transistors include a substrate 102, a gate electrode 104, a gate dielectric 106, a channel 108, a source electrode 110, and a drain electrode 112. In each of FIGS. 1A-1D, the gate dielectric 106 is positioned between the gate electrode 104 and the source and drain electrodes 110, 112 such that the gate dielectric 106 physically separates the gate electrode 104 from the source and the drain electrodes 110, 112. Additionally, in each of the FIGS. 1A-1D, the source and the drain electrodes 110, 112 are separately positioned thereby forming a region between the source and drain electrodes 110, 112 for interposing the channel 108. Thus, in each of FIGS. 1A-1D, the gate dielectric 106 is positioned adjacent the channel 108, and physically separates the source and drain electrodes 110,112 from the gate electrode 104. Additionally, in each of the FIGS. 1A-1D, the channel 108 is positioned adjacent the gate dielectric 106 and contacts the source and drain electrodes 110, 112.

In various embodiments, such as in the double-gate embodiments shown in FIGS. 1E and 1F, two gate electrodes 104-1, 104-2 and two gate dielectrics 106-1, 106-2 are illustrated. In such embodiments, the positioning of the gate dielectrics 106-1, 106-2 relative to the channel 108 and the source and drain electrodes 110, 112, and the positioning of the gate electrodes 104-1, 104-2 relative to the gate dielectrics 106-1, 106-2 follow the same positioning convention described above where one gate dielectric and one gate electrode are illustrated. That is, the gate dielectrics 106-1, 106-2 are positioned between the gate electrodes 104-1, 104-2 and the source and drain electrodes 110, 112 such that the gate dielectrics 106-1, 106-2 physically separate the gate electrodes 104-1, 104-2 from the source and the drain electrodes 110, 112.

In each of FIGS. 1A-1F, the channel 108 interposed between the source and the drain electrodes 110, 112 provide a controllable electric pathway between the source and drain electrodes 110, 112 such that when a voltage is applied to the gate electrode 104, an electrical charge can move between the source and drain electrodes 110, 112 via the channel 108. The voltage applied at the gate electrode 104 can vary the ability of the channel 108 to conduct the electrical charge and thus, the electrical properties of the channel 108 can be controlled, at least in part, through the application of a voltage at the gate electrode 104.

Figure 2:
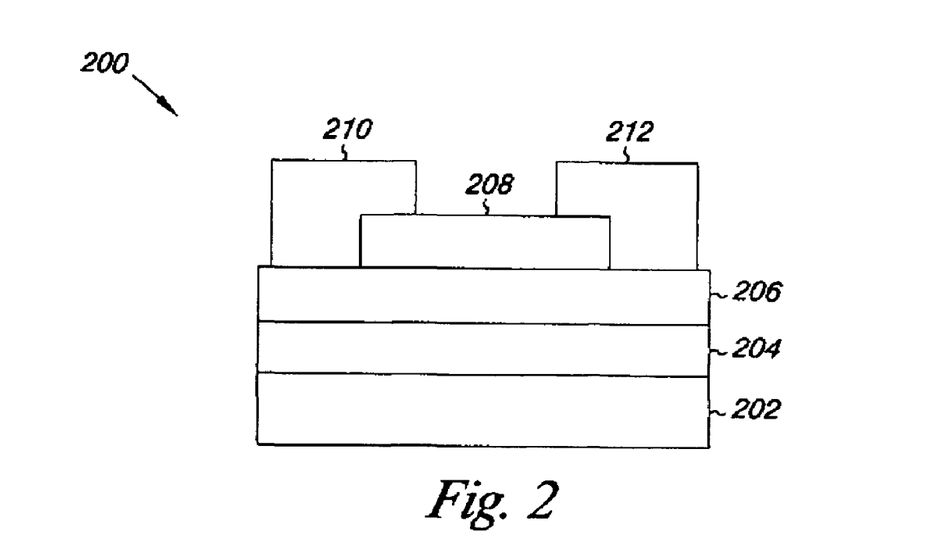
FIG. 2 illustrates a cross-sectional schematic of an embodiment of a thin-film transistor according to an example embodiment.

A more detailed description of an embodiment of a thin-film transistor is illustrated in FIG. 2. FIG. 2 illustrates a cross-sectional view of an exemplary bottom gate thin-film transistor 200. It will be appreciated that the different portions of the thin-film transistor described in FIG. 2, the materials in which they constitute, and the methods in which they are formed can be equally applicable to any of the transistor embodiments described herein, including those described in connection with FIGS. 1A-1F.

Moreover, in the various embodiments, the thin-film transistor 200 can be included in a number of devices including an active matrix display screen device, a logic inverter, and an amplifier. The thin-film transistor 200 can also be included in an infrared device, where transparent components are also used.

As shown in FIG. 2, the thin-film transistor 200 can include a substrate 202, a gate electrode 204 positioned adjacent the substrate 202, a gate dielectric 206 positioned adjacent the gate electrode 204, and a channel 208 contacting the gate dielectric 206, a source electrode 210, and a drain electrode 212. In the various embodiments, the channel 208 can be positioned between and electrically couple the source electrode 210 and the drain electrode 212.

In the embodiment shown in FIG. 2, the substrate 202 includes glass. However, substrate 202 can include any suitable substrate material or composition for implementing the various embodiments.

The substrate 202 illustrated in FIG. 2 can include a blanket coating of ITO, i.e., indium-tin oxide to form the gate electrode 204. However, any number of materials can be used for the gate electrode 204. Such materials can include transparent materials such as an n-type doped $In_2O_3$, $SnO_2$, or ZnO, and the like. Other suitable materials include metals such as In, Sn, Ga, Zn, Al, Ti, Ag, Cu, and the like. In the embodiment illustrated in FIG. 2, the thickness of the gate electrode 204 is approximately 200 nm. The thickness of a gate electrode can vary depending on the materials used, device type, and other factors.

The gate dielectric 206 shown in FIG. 2 is also blanket coated. Although the gate electrode 204 and gate dielectric 206 are shown as blanket coated, unpatterned layers in FIG. 2, they can be patterned. In the various embodiments, the gate dielectric 206 can include various materials having insulating properties representative of gate dielectrics. Such materials can include tantalum pentoxide ($Ta_2O_5$), strontium titanate (STO), barium strontium titanate (BST), lead zirconium titanate (PZT), strontium bismuth tantalate (SBT), bismuth zirconium titanate (BZT), silicon dioxide ($SiO_2$), silicon nitride ($Si_3N_4$), magnesium oxide (MgO), aluminum oxide ($Al_2O_3$), hafnium(IV)oxide ($HfO_2$), zirconium(IV)oxide ($ZrO_2$), various organic dielectric materials, and the like.

In the various embodiments, the source electrode 210 and the drain electrode 212 are separately positioned adjacent the gate dielectric 206. In the embodiment shown in FIG. 2, the source and drain electrodes 210, 212 can be formed from the same materials as those discussed in regards to the gate electrode 204. In FIG. 2, the source and drain electrodes 210, 212 have a thickness of approximately 200 nm. However, the thickness can vary depending on composition of material used, application in which the material will be used, and other factors. The choice of source and drain electrode material can vary depending on the application, device, system, etc., in which they will be used. Overall device performance is likely to vary depending on the source and drain materials. For example, in devices where a substantially transparent thin-film transistor is desired, the materials for the source, drain, and gate electrodes can be chosen for that effect.

In the various embodiments, the channel 208 can be formed from a multicomponent oxide semiconductor that includes at least a first binary oxide and a second binary oxide selected from one of a first group, a second group, and a third group, each discussed herein, to form an isovalent semiconductor. In the various embodiments, the first and second binary oxides include an atomic composition of a first metal (A): second metal (B) in a ratio (A:B), where A and B are each different and each in a range of about 0.05 to about 0.95.

In the various embodiments, these materials can include various morphologies depending on composition, processing conditions, and other factors. The various morphological states can include amorphous states, and polycrystalline forms. A polycrystalline form can include a single-phase crystalline form or a mixed-phase crystalline form. The form of these materials can be micro- or nano-sized and can include wires, ribbons, rods, or other shapes. Additionally, in the various embodiments, the source, drain, and gate electrodes can include a substantially transparent material. By using substantially transparent materials for the source, drain, and gate electrodes, areas of the thin-film transistor can be transparent to the portion of the electromagnetic spectrum that is visible to the human eye. In the transistor arts, a person of ordinary skill will appreciate that devices such as active matrix liquid crystal displays having display elements (pixels) coupled to thin-film transistors (TFT's) having substantially transparent materials for selecting or addressing the pixel to be on or off will benefit display performance by allowing more light to be transmitted through the display.

Referring back to FIG. 2, the channel 208 is formed as an isovalent semiconductor with a channel thickness of about 50 nm, however, in various embodiments the thickness of the channel can vary depending on a variety of factors including whether the channel material is amorphous or polycrystalline, and the device in which the channel is to be incorporated.

In this embodiment, the channel 208 is positioned adjacent the gate dielectric 206 and between the source and drain electrodes 210, 212, so as to contact and electrically couple the electrodes 210 and 212. An applied voltage at the gate electrode 204 can facilitate electron accumulation in the channel 208. In addition, the applied voltage can enhance electron injection from the source electrode 210 to the channel 208 and electron extraction therefrom by the drain electrode 212. In the embodiments of the present disclosure, the channel 208 can allow for on/off operation by controlling current flowing between the drain electrode 212 and the source electrode 210 using a voltage applied to the gate electrode 204.

As used herein, the "isovalent semiconductor" can include a film formed from multicomponent oxide semiconductors that have at least a first binary oxide and a second binary oxide. In addition, "isovalent semiconductor" as used herein includes that a substantial amount (e.g., 99 percent or greater) of the cations in the isovalent semiconductor share a like oxidation state. As will be appreciated, the oxidation state of the cations in the isovalent semiconductor may not all be of the same value. As such, there may be a detectable fraction of cations present in the isovalent semiconductor that have one or more variants of oxidation states.

In one embodiment, the first binary oxide and the second binary oxide are selected from one of a first group of CdO, SrO, CaO, and MgO isovalent compounds, a second group of $In_2O_3$ and $Ga_2O_3$ isovalent compounds, and a third group of $SnO_2$, $GeO_2$, $PbO_2$, and $TiO_2$ isovalent compounds. In addition, the first binary oxide and the second binary oxide could be selected from one of the first group that includes ZnO (i.e., the first group includes ZnO, CdO, SrO, CaO, and MgO isovalent compounds). In an additional embodiment, when the first binary oxide is selected as one of either SrO and CaO, the second binary oxide can be selected from CdO, ZnO and MgO isovalent compounds to form the isovalent semiconductor.

In further embodiments, the first binary oxide and the second binary oxide can include an atomic composition of a first metal (A): second metal (B) in a ratio (A:B), where A and B are each different and each in a range of about 0.05 to about 0.95. In an additional embodiment, A and B are each in a range of about 0.10 to about 0.90. These atomic compositions do not take into consideration the optional presence of oxygen and other elements. They are merely a representation of the relative ratio of the first and second metals.

The isovalent semiconductor, as described herein, shows very satisfactory electrical performance (depending on component material selection, processing conditions, etc.), specifically in the area of channel mobility. The isovalent semiconductor can exhibit surprising increased channel mobility. As appreciated by one skilled in the art, mobility is a characteristic that can help in determining thin-film transistor performance, as maximum operating frequency, speed, and drive current increase in direct proportion to channel mobility. In addition, the isovalent semiconductor can be transparent in both the visible and infrared spectrums, allowing for an entire thin-film transistor to be optically transparent throughout the visible region of the electromagnetic spectrum.

The use of the isovalent semiconductor illustrated in the embodiments of the present disclosure is beneficial for a wide variety of thin-film applications in integrated circuit structures. For example, such applications include transistors, as discussed herein, such as thin-film transistors, horizontal, vertical, coplanar electrode, staggered electrode, top-gate, bottom-gate, single-gate, and double-gate, to name only a few. In the various embodiments, transistors (e.g., thin-film-transistors) of the present disclosure can be provided as switches or amplifiers, where applied voltages to the gate electrodes of the transistors can affect a flow of electrons through the isovalent semiconductor of the channel. As one of ordinary skill will appreciate, transistors can operate in a variety of ways. For example, when a transistor is used as a switch, the transistor can operate in the saturation region, and where a transistor is used as an amplifier, the transistor can operate in the linear region. In addition, the use of transistors incorporating channels of an isovalent semiconductor in integrated circuits and structures incorporating integrated circuits such as visual display panels (e.g., active matrix LCD displays) such as that shown and described in connection with FIG. 4 below. In display applications and other applications, it will often be desirable to fabricate one or more of the remaining portions of the thin-film transistor, e.g., source, drain, and gate electrodes, to be at least partially transparent.

In FIG. 2, the source electrode 210 and the drain electrode 212 include an ITO having a thickness of about 200 nm. In the various embodiments however, the thickness can vary depending on a variety of factors including type of materials, applications, and other factors. In various embodiments, the electrodes 210, 212, may include a transparent conductor, such as an n-type doped wide-bandgap semiconductor. Examples include, but are not limited to, n-type doped $In_2O_3$, $SnO_2$, indium-tin oxide (ITO), or ZnO, and the like. The electrodes 110, 112 may also include a metal such as In, Sn, Ga, Zn, Al, Ti, Ag, Cu, Au, Pt, W, or Ni, and the like. In the various embodiments of the present disclosure, all of the electrodes 104, 110, and 112 may include transparent materials such that the various embodiments of the transistors may be made substantially transparent.

The various portions of the transistor structures described herein can be formed using a variety of techniques. For example, the gate dielectric 206 may be deposited by a low-pressure CVD process using $Ta(OC_2H_5)_5$ and $O_2$ at about 430° C., and may be subsequently annealed in order to reduce leakage current characteristics. Thin-film deposition techniques such as evaporation (e.g., thermal, e-beam), physical vapor deposition (PVD) (e.g., dc reactive sputtering, rf magnetron sputtering, ion beam sputtering), chemical vapor deposition (CVD), atomic layer deposition (ALD), pulsed laser deposition (PLD), molecular beam epitaxy (MBE), and the like may be employed. Additionally, alternate methods may also be employed for depositing the various portions of the transistor of the embodiments of the present disclosure. Such alternate methods can include anodization (electrochemical oxidation) of a metal film, as well as deposition from a liquid precursor such as spin coating and ink-jet printing including thermal ink-jet and piezoelectric drop-on-demand printing. Film patterning may employ photolithography combined with etching or lift-off processes, or may use alternate techniques such as shadow masking. Doping of one or more of the layers (e.g., the channel illustrated in FIG. 2) may also be accomplished by the introduction of oxygen vacancies and/or substitution of aliovalent elements.

Embodiments of the present disclosure also include methods of forming metal containing films on a surface of a substrate or substrate assembly, such as a silicon wafer, with or without layers or structures formed thereon, used in forming integrated circuits, and in particular thin-film transistors as described herein. It is to be understood that methods of the present disclosure are not limited to deposition on silicon wafers; rather, other types of wafers (e.g., gallium arsenide, glass, etc.) can be used as well.

Furthermore, other substrates can also be used in methods of the present disclosure. These include, for example, fibers, wires, etc. In general, the films can be formed directly on the lowest surface of the substrate, or they can be formed on any of a variety of the layers (i.e., surfaces) as in a patterned wafer, for example.

Figure 3:
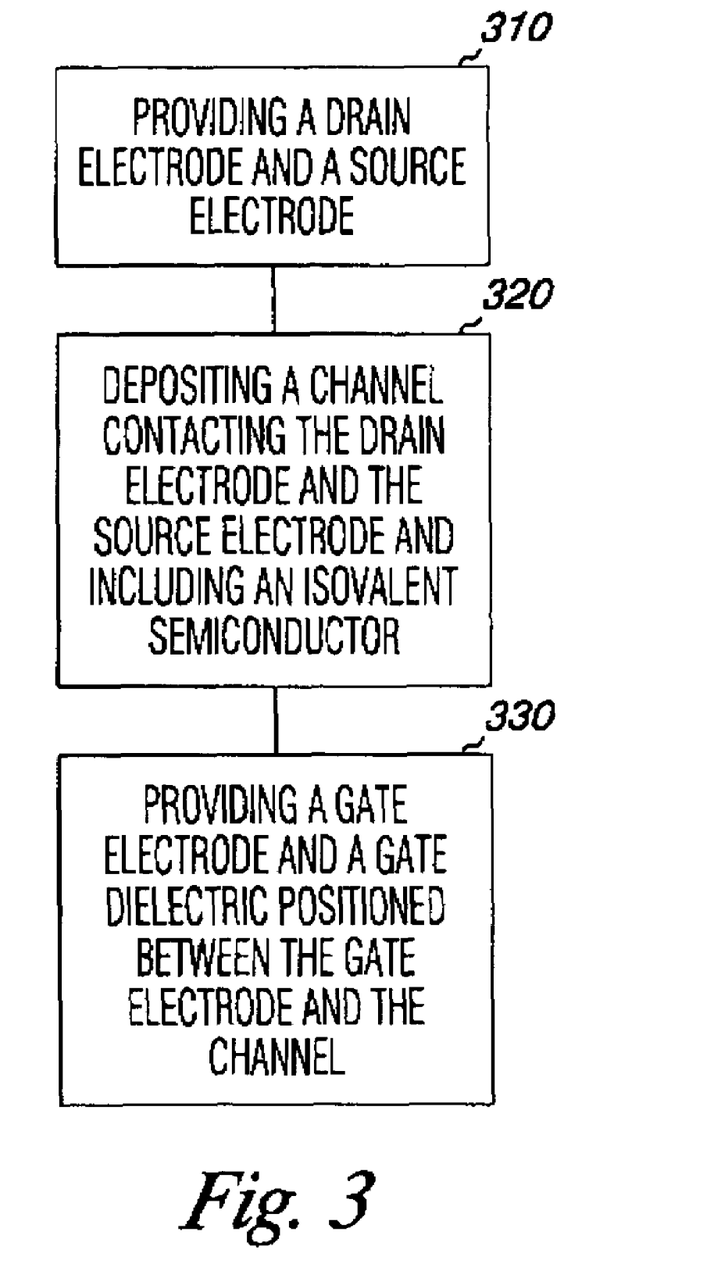
FIG. 3 illustrates a method embodiment for manufacturing an embodiment of a thin-film transistor according to an example embodiment.

In one embodiment, a method for fabricating a semiconductor structure is illustrated in FIG. 3. In the various embodiments of the disclosure, a substrate or substrate assembly can be provided in forming the semiconductor structure. As used herein, the term "substrate" refers to the base substrate material layer, e.g., the lowest layer of glass material in a glass wafer. The term "substrate assembly" refers to the substrate having one or more layers or structures formed thereon. Examples of substrate types include, but are not limited to, glass, plastic, and metal, and include such physical forms as sheets, films, and coatings, among others, and may be opaque or substantially transparent.

In block 310, a drain electrode and a source electrode can both be provided. For example, both the drain electrode and the source electrode can be provided on the substrate of substrate assembly.

In block 320, a channel contacting the drain electrode and the source electrode, and including an isovalent semiconductor, can be deposited. For example, the channel can be deposited between the drain electrode and a source electrode so as to electrically couple the two electrodes. In the various embodiments, depositing the channel contacting the drain electrode and the source electrode can include providing a precursor composition including one or more precursor compounds from one of the first group that includes zinc (Zn), cadmium (Cd), and magnesium (Mg), the second group that includes indium (In) and gallium (Ga), and the third group that includes tin (Sn), germanium (Ge), lead (Pb), and titanium (Ti). Various combinations of the precursor compounds described herein can be used in the precursor composition. Thus, as used herein, a "precursor composition" refers to a solid or liquid that includes one or more precursor compounds of the formulas described herein optionally mixed with one or more compounds of formulas other than those described herein. For example, zinc precursor compounds and cadmium precursor compounds of the first group can be provided in one precursor composition or in separate compositions. Alternatively, one precursor compound could be envisioned to provide both metals. As used herein, "liquid" refers to a solution or a neat liquid (a liquid at room temperature or a solid at room temperature that melts at an elevated temperature). As used herein, a "solution" does not call for complete solubility of the solid; rather, the solution may have some undissolved material, more desirably, however, there is a sufficient amount of the material that can be carried by the organic solvent into the vapor phase for chemical vapor deposition processing. The precursor compounds as used herein can also include one or more organic solvents suitable for use in a chemical vapor deposition system, as well as other additives, such as free ligands, that assist in the vaporization of the desired compounds.

A wide variety of Zn, Cd, Mg, In, Ga, Sn, Ge, Pb, and Ti precursor compounds suitable for thin-film deposition techniques can be used with the embodiments of the present disclosure. Examples of the precursor compounds include, but are not limited to, the metals and oxides of the metals, including $ZnO$, $ZnO_2$, $CdO$, $SrO$, $SrO_2$, $CaO$, $CaO_2$, $MgO$, $MgO_2$, $InO$, $In_2O_3$, $GaO$, $Ga_2O$, $Ga_2O_3$, $SnO$, $SnO_2$, $GeO$, $GeO_2$, $PbO$, $PbO_2$, $Pb_2O_3$, $Pb_3O_4$, $TiO$, $TiO_2$, $Ti_2O_3$ and $Ti_xO_5$ isovalent compounds. Although specific compounds are illustrated herein, a wide variety of precursor compounds can be used as long as they can be used in a deposition process. In the various embodiments of the present disclosure, the Zn, Cd, Mg, In, Ga, Sn, Ge, Pb, and Ti precursor compounds can include neutral compounds and may be liquids or solids at room temperature. If they are solids, they are sufficiently soluble in a solvent to allow for vaporization, they can be vaporized or sublimed, or ablated (e.g., by laser ablation or sputtering) from the solid state, or they have melting temperatures below their decomposition temperatures. Thus, many of the precursor compounds described herein are suitable for use in vapor deposition techniques, such as chemical vapor deposition (CVD) techniques, (e.g., flash vaporization techniques, bubbler techniques, and/or microdroplet techniques).

The precursor compounds described herein can be used in precursor compositions for ink-jet deposition, sputtering, and vapor deposition techniques (e.g., chemical vapor deposition (CVD) or atomic layer deposition (ALD)). Alternatively, certain compounds described herein can be used in other deposition techniques, such as gravure printing, spin-on coating, and the like. Typically, those compounds containing organic R groups with a low number of carbon atoms (e.g., 1-4 carbon atoms per R group) are suitable for use with vapor deposition techniques. Those compounds containing organic R groups with a higher number of carbon atoms (e.g., 5-12 carbon atoms per R group) are generally suitable for spin-on or dip coating.

As used herein, the term "organic R groups" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present disclosure, the organic groups are those that do not interfere with the formation of a metal-containing film. They may be of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkenyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Still referring to FIG. 3, the channel of the isovalent semiconductor from the precursor composition can be deposited on a surface of the substrate or substrate assembly. For example, the channel of the isovalent semiconductor from the precursor composition can be deposited from the precursor composition to contact the drain electrode and the source electrode of a thin-film transistor, thereby electrically coupling the drain and source electrodes. In various embodiments, the channel can employ a physical vapor deposition technique such as sputter coating, which can include vaporizing the precursor composition and directing it toward the substrate or substrate assembly. Other methods for depositing the channel can include one or more physical vapor deposition techniques such as dc reactive sputtering, rf sputtering, magnetron sputtering, ion beam sputtering, or combinations thereof.

In the various embodiments, the isovalent semiconductor included in the channel can have a uniform composition throughout its thickness, although this is not a requisite. For example, a precursor compound for the first binary oxide could be deposited first and then a combination of precursor compounds for the first and second binary oxides could be deposited with increasing amounts of the precursor compound for the second binary oxide deposited as the film is formed. As will be appreciated, the thickness of the isovalent semiconductor will be dependent upon the application for which it is used. For example, the thickness can have a range of about 1 nanometer to about 1,000 nanometers. In an alternative embodiment, the thickness can have a range of about 10 nanometers to about 200 nanometers.

In the embodiments of the present disclosure, the precursor compounds can include one or more precursor compounds for the first binary metal semiconductors and one or more precursor compounds for the second binary metal semiconductors. The precursor compounds for the binary metal semiconductors are typically mononuclear (i.e., monomers in that they contain one metal per molecule), although weakly bound dimers (i.e., dimers containing two monomers weakly bonded together through hydrogen or dative bonds) are also possible. In additional embodiments of the present disclosure, the precursor compounds for the binary metal semiconductors can include organometalic compounds suitable for vapor deposition. Example of such organometalic compounds include, but are not limited to, zinc acethylacetonate $[Zn(C_5H_7O_2)_2]$ and indium acethylacetonate $[In(C_5H_7O_2)_3]$.

As discussed herein, an example of the precursor compounds for the first binary metal semiconductor of the isovalent semiconductor for use in a sputtering process in the embodiments of the present disclosure can include those to form CdO, which is an n-type semiconductor with excellent electron transport properties. One of the remaining two binary metal semiconductor of the first group of isovalent compounds, MgO, exhibits a significantly larger bandgap relative to CdO. As such, MgO is typically considered a dielectric, and taken on its own merit would not be considered as a likely candidate for a transistor channel. The isovalence of MgO with the CdO, however, introduces the possibility of tuning of various material properties (i.e., bandgap, chemical reactivity, etc) between those of the individual binary oxides, thus allowing adaptation of a relevant property for a given application.

In addition, binary metal oxides selected in groups of two or more from within one of the three groups listed herein allow for an isovalent semiconductor having a spectrum of metal to metal ratios (e.g., an atomic composition of a first metal (A): second metal (B) having a ratio (A:B), where A and B are each different and each in a range of about 0.05 to about 0.95). In this embodiment, this metal to metal ratio of the binary oxides in the isovalent semiconductor excludes any "pure" metal oxide semiconductors. As used herein, a "pure" material is understood to include some degree of "doping" with impurities; thus the compositional range for the first and second binary metal semiconductors as illustrated in the embodiment of the present disclosure should be such that the quantity of the minor component is large enough so as not to be considered a "dopant" within a film defined by the major component.

In addition, since isovalent compounds are not necessarily isostructural, a solid solution may not, in many cases, be achievable across the entire phase space between the two (or more) binary metal oxides. However, even in the case where a multiphase mixture (e.g., $ZnO+Zn_xCd_{1-x}O$ [solid solution]+ CdO) is attained, performance of the isovalent semiconductor as the channel (i.e., mobility) is likely to be intermediate between those of the constituent binary metal oxides (although, for a multi-phase film, the effective bandgap is likely to be established by the lowest of the bandgaps of the existing phases, rather than taking some intermediate value as might be expected for a solid solution).

When the channel is deposited in a thin-film by sputtering by use of the above-mentioned target (e.g., substrate or substrate assembly), there can be obtained a single-phase crystalline form for the channel. Alternatively, embodiments of the isovalent semiconductor can exhibit a mixed-phase crystalline form resulting from sputtering by use of the above-mentioned target. For example, the mixed-phase crystalline form can include, but is not limited to, two or more phases that can include, for example, the first metal, oxide semiconductor, the second metal oxide semiconductor, and a third binary oxide from the first group of ZnO, CdO, SrO, CaO, and MgO isovalent compounds. Alternatively, the mixed-phase crystalline form can include, but is not limited to, two or more phases that can include, for example, the first metal oxide semiconductor, the second metal oxide semiconductor, the third binary oxide, and a fourth binary oxide from either of the first group ZnO, CdO, SrO, CaO, and MgO isovalent compounds or the third group $SnO_2$, $GeO_2$, $PbO_2$, and $TiO_2$ isovalent compounds. For these examples, the atomic composition of a first metal: second metal: third metal in a ratio of A:B:C, where A, B, and C are each different and each in a range of about 0.025 to about 0.95. In addition, the atomic composition of a first metal: second metal: third metal: fourth metal in a ratio of A:B:C:D, where A, B, C, and D are each different and each in a range of about 0.025 to about 0.95. Alternatively, the A, B, C, and D can each be in a range of about 0.017 to about 0.95 and in a range of about 0.10 to about 0.80.

In additional embodiments, the isovalent semiconductor can have a substantially amorphous form. For example, the isovalent semiconductor can include a ratio of the atomic composition of the first metal (A) of the first binary oxide to the second metal (B) of the second binary oxide, where A and B are each different and each in a range of about 0.05 to about 0.95. In an additional embodiment, A and B are each different and each in a range of about 0.10 to about 0.90.

In one specific example, CdO and MgO from the first group isovalent compounds can include a wider range of the atomic composition ratio of the first metal (A) to the second metal (B) than those discussed herein. For example, since CdO and MgO are both isostructural, in addition to being isovalent, a solid solution might be expected to be stable over a large portion of the intermediate phase space. As a result, the values for A and B of the first metal (A) to the second metal (B) ratio (A:B) can each be in a range of 0.0 to 1.00. In other words, the compositional range of CdO and MgO can include either pure CdO or MgO, in addition to ratios of the two compounds that fall there between.

Sputtering or chemical vapor deposition processes can be carried out in an atmosphere of inert gas and/or a reaction gas to form a relatively pure multicomponent oxide semiconductor for the isovalent semiconductor containing at least the first binary oxide and the second binary oxide. The inert gas is typically selected from the group including nitrogen, helium, argon, and mixtures thereof. In the context of the present disclosure, the inert gas is one that is generally unreactive with the precursor compounds described herein and does not interfere with the formation of an isovalent semiconductor.

The reaction gas can be selected from a wide variety of gases reactive with the compound described herein, at least at a surface under the conditions of deposition. Examples of reaction gases include hydrogen and oxidizing gases such as $N_2O$ and $O_2$. Various combinations of carrier gases and/or reaction gases can be used in the embodiments of the present disclosure to form the isovalent semiconductor.

For example, in a sputtering process for the isovalent semiconductor, the process may be performed by using a mixture of argon and oxygen as the sputtering gas at a particular flow rate, with the application of an RF power for achieving the desired deposition in a sputter deposition chamber. However, it should be readily apparent that any manner of forming the isovalent semiconductor is contemplated in accordance with the present disclosure and is in no manner limited to any particular process, e.g., sputtering, for formation thereof.

In block 330, both a gate electrode and a gate dielectric positioned between the gate electrode and the channel can be provided in forming an embodiment of the thin-film transistor of the present disclosure.

Figure 4:
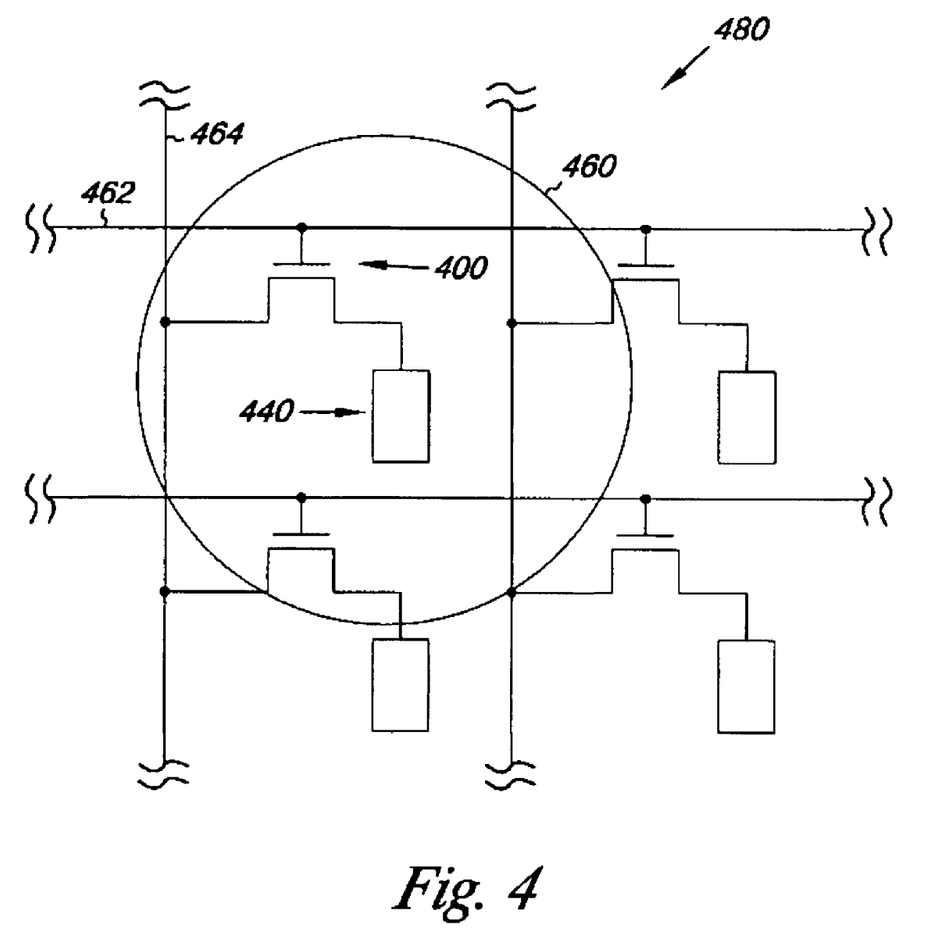
FIG. 4 illustrates an embodiment of an active matrix display area according to an example embodiment.

The embodiments described herein may be used for fabricating chips, integrated circuits, monolithic devices, semiconductor devices, and microelectronic devices, such as display devices. For example, FIG. 4 illustrates an embodiment of a display device such as an active-matrix liquid-crystal display (AMLCD) 480. In FIG. 4, the AMLCD 480 can include pixel devices (i.e., liquid crystal elements) 440 in a matrix of a display area 460. The pixel devices 440 in the matrix can be coupled to thin-film transistors 400 also located in the display area 460. The thin-film transistor 400 can include embodiments of the thin-film transistors as disclosed herein. Additionally, the AMLCD 480 can include orthogonal control lines 462 and 464 for supplying an addressable signal voltage to the thin-film transistors 400 to influence the thin-film transistors to turn on and off and control the pixel devices 440, e.g., to provide an image on the AMLCD 480.

Figure 5:
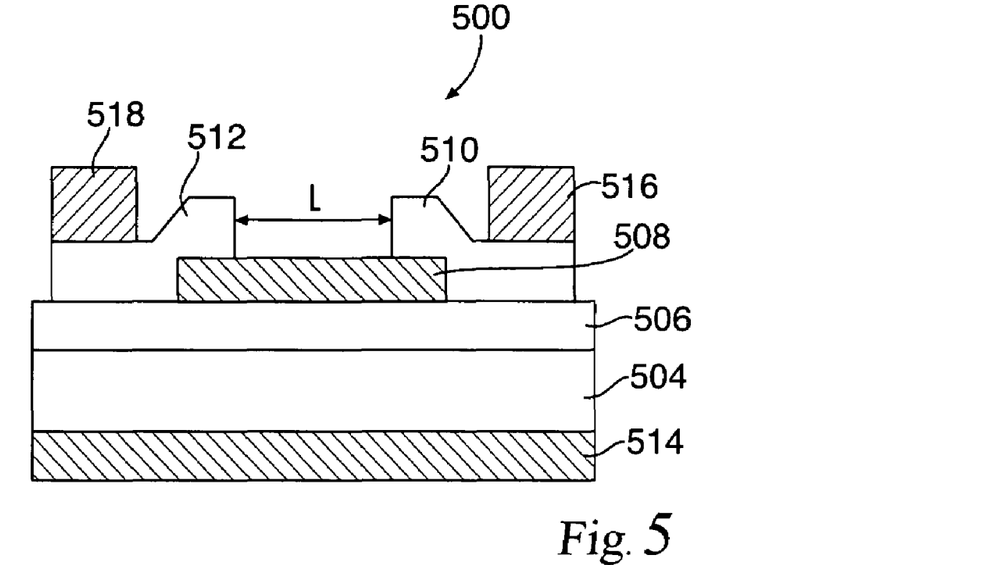
FIG. 5 is a cross sectional view schematically illustrating another embodiment of the thin-film transistor of FIG. 1B according to an example embodiment.
Figure 6:
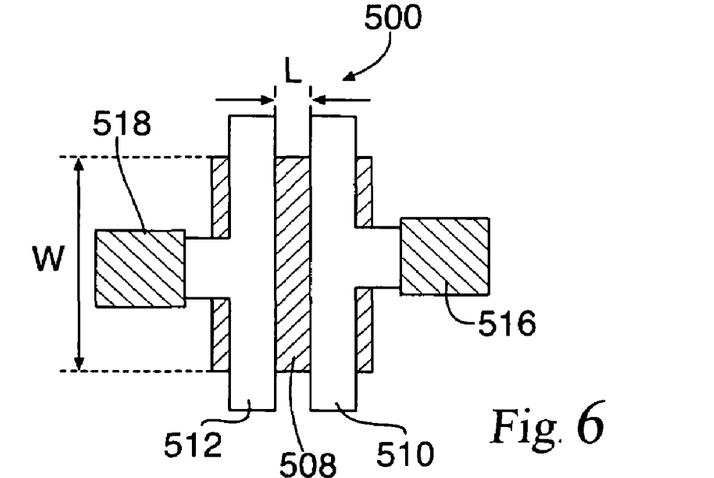
FIG. 6 is a top plan view of the thin-film transistor of FIG. 5 according to an example embodiment.

FIGS. 5 and 6 illustrate transistor 500, another embodiment of thin-film transistor 200 shown in FIG. 2. Transistor 500 generally includes gate electrode 504, gate dielectric 506, channel 508, source electrode 510, drain electrode 512, gate contact 514, source contact 516 and drain contact 518. In the particular example illustrated, gate electrode 504 also serves as a substrate for remaining elements or layers of transistor 500. Gate electrode 504 constitutes a heavily-doped silicon wafer. In other embodiments, gate electrode 504 may be formed from other transparent or non-transparent electrically conductive materials.

Gate dielectric 506 extends between gate electrode 504 and channel 508. In the particular example illustrated, gate dielectric 506 constitutes a thermally-grown $SiO_2$ layer of material having a thickness of about 100 nanometers. In other embodiments, gate dielectric 506 may be formed from other dielectric materials and may have other dimensions.

Channel 508 constitutes a semiconductor layer extending between source electrode 510 and drain electrode 512. In the particular example illustrated, channel 508 includes an oxide comprising a combination of isovalent cations selected from within the D block and the P block of the Periodic Table. In the particular example illustrated, channel 508 includes indium gallium oxide. According to one embodiment, channel 508 is deposited upon gate dielectric 506 with radio frequency (rf) sputter deposition. In particular, $In_2O_3$ and $Ga_2O_3$ 3-inch diameter targets are sputtered simultaneously to yield a compositional gradient (In:Ga atomic ratio) across the substrate (over gate dielectric 506), which includes multiple such thin-film transistor structures 500. In one embodiment, such sputter deposition takes place at a pressure of about 5 mTorr with a sputter gas of $Ar/O_2$ (90/10%) with a power of about 100 W for each target. In other embodiments, the indium gallium oxide may be deposited upon gate dielectric 506 using other techniques.

Source electrode 510 and drain electrode 512 constitute layers of electrically conductive material upon gate dielectric 506 and in contact with channel 508. In the particular example illustrated, source electrode 510 and gate electrode 512 constitute indium tin oxide having a thickness of about 200 nanometers. In one embodiment, source electrode 510 and drain electrode 512 are formed by radio frequency sputtering. In other embodiments, source electrode 510 and drain electrode 512 may constitute other electrically conductive materials, may be deposited by other techniques and may have other thicknesses. In the particular example illustrated, source electrode 510 and drain electrode 512 are spaced from one another by a distance L of about 200 micrometers such that a ratio of a width W of channel 508 to the distance L separating electrodes 510 and 512 (W/L) is approximately 11. In other embodiments, such relative dimensions may be varied.

Gate contact 514 constitutes a layer of electrically conductive material in electrical connection with gate electrode 504. In one embodiment, gate contact 514 may constitute an adhesion layer of tantalum having a thickness of about 10 nanometers and a layer of gold having a thickness of about 300 nanometers. In other embodiments, other electrically conductive materials may be utilized for gate contact 514.

Source contact 516 and drain contact 518 constitute layers of electrically conductive material in electrical connection with source electrode 510 and drain electrode 512. In one embodiment, contacts 516 and 518 may be formed from a two-layer stack, an adhesion layer of tantalum and a layer of gold. In other embodiments, contacts 516 and 518 may be formed from other electrically conductive materials.

Following deposition of channel 508, channel 508 and supporting structures are furnace annealed. In one embodiment, such structures experience a 60-minute dwell time and a 2-degree Celsius per minute ramp rate up and down. In one embodiment, channel 508 is annealed at a temperature of between about 250 and 350 and nominally about 300 degrees Celsius. In another embodiment, channel 508 is furnace annealed at a temperature of between about 550 and 650 and nominally about 600 degrees Celsius. In yet another embodiment, channel 508 is not annealed.

Figure 7:
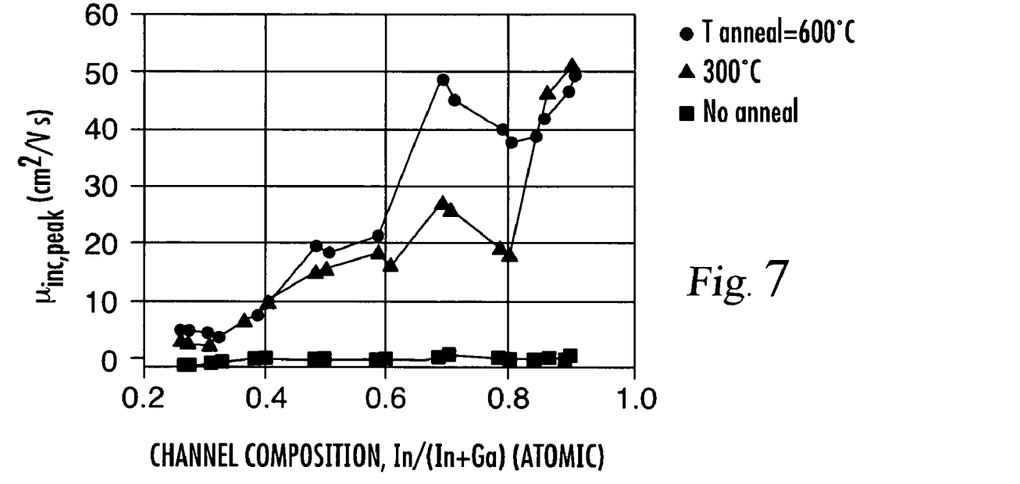
FIG. 7 is a graph illustrating field-effect mobility (peak incremental mobility) of the thin-film transistor of FIGS. 5 and 6 as a function of channel composition according to an example embodiment.
Figure 8:
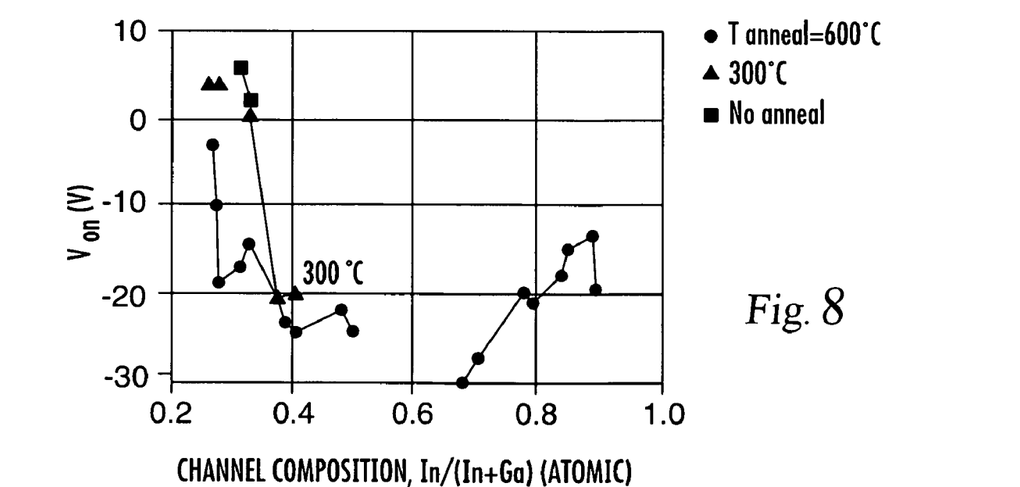
FIG. 8 is a graph illustrating the turn-on voltage of the transistor of FIGS. 5 and 6 as a function of channel composition according to an example embodiment.

FIGS. 7 and 8 illustrate peak channel field-effect mobility (incremental mobility) ($\mu_{inc,peak}$, the peak incremental mobility value within the selected gate voltage range, $-10$ V to $+30$ V, extracted from a drain current vs. gate-to-source voltage measurement with small drain-to-source voltage such that the device operates in the linear region) exhibited by various embodiments of transistor 500 as well as turn-on voltages ($V_{on}$, the gate voltage above which the drain current begins to increase from its minimum "off" level, in a drain current vs. gate-tb-source voltage measurement) exhibited by transistor 500 as a function of the composition of channel 508 and the furnace annealing temperature. As shown by FIG. 7, the peak incremental mobility of transistor 500 generally increases as the In content (i.e., the atomic ratio of In/(In+Ga)) of channel 508 increases, with substantially enhanced peak incremental mobility values found for channel 508 composition characterized by an atomic ratio of In/(In+Ga) of greater than or equal to about 0.5. As shown by FIG. 8, transistor 500 having a channel 508 composition characterized by an atomic ratio of In/(In+Ga) of greater than or equal to about 0.1 and less than or equal to about 0.5 has a lower (i.e., of lesser magnitude) turn-on voltage and the turn-on voltage increases (i.e., moves toward less negative and/or more positive values) with decreasing In/(In+Ga) atomic ratio. As shown by FIG. 8, transistor 500 having a channel composition characterized by an atomic ratio of In/(In+Ga) of about 0.25 to about 0.35 exhibited positive turn-on voltages in the absence of a final anneal and for an anneal temperature of 300 degree Celsius. Also as shown by FIG. 8, transistor 500 having a channel 508 composition characterized by an atomic ratio of In/(In+Ga) of greater than or equal to about 0.7 and annealed at a temperature of 600 degrees Celsius has a lower (i.e., of lesser magnitude) turn-on voltage, and the turn-on voltage increases (i.e., moves toward less negative and/or more positive values) with increasing In/(In+Ga) atomic ratio.

As shown by FIGS. 7 and 8, in one embodiment in which channel 508 has an atomic ratio of In/(In+Ga) of about 0.9 which is annealed at a temperature of about 600 degrees Celsius, transistor 500 exhibits a peak incremental mobility of greater than about 50 cm$^2$/V s in combination with a turn-on voltage ($V_{on}$) of about −15 volts. As shown by FIGS. 7 and 8, in another embodiment in which channel 508 has a composition with an atomic ratio of In/(In+Ga) of about 0.3 that is annealed at a temperature of about 300 degrees Celsius, transistor 500 exhibits a peak incremental mobility of about 3 cm$^2$/V s in combination with a relatively low turn-on voltage of about 0 volts. As shown by FIGS. 7 and 8, in yet another embodiment in which channel 508 has a composition with an atomic ratio of In/(In+Ga) of about 0.3 and in which channel 508 is not annealed, transistor 500 has an incremental mobility of about 0.1 cm$^2$/V s in combination with a relatively low turn-on voltage of about 2 volts. The relatively high mobility and attainable turn-on voltage as well as the relatively low processing temperatures of channel 508, including indium gallium oxide facilitates lower cost fabrication of transistor 500. At the same time, because channel 508, formed from indium gallium oxide, is transparent, transistor 500 may be employed in display devices in which light is to pass through channel 508. The aforementioned results shown in FIGS. 7 and 8 are tied to the particulars of the associated fabrication process, structure, etc., and may not be universally representative of indium gallium oxide itself. A different choice of fabrication process, structure, material selection for other TFT layers, etc. may provide substantially different results for a similar set of stoichiometry (In:Ga ratio) and anneal temperature.

Although channel 508 is illustrated as being incorporated in a bottom gate transistor 500, channel 508 may alternatively be employed in other transistor configurations such as the transistor embodiments described with respect to FIGS. 1A-1F. In addition to being usable in a display device, transistor 500 may also be employed in other devices including an active matrix display screen device, a logic converter or an amplifier. Transistor 500 may also be employed as a transparent component in other devices such as an infra-red device.

In another embodiment, channel 508 may alternatively include a combination of tin oxide and an oxide of one or more 4+ cations selected from within the D block and/or the P block of the Periodic Table in lieu of indium gallium oxide. For example, in one embodiment, channel 508 may include one of tin titanium oxide, tin germanium oxide, and tin titanium germanium oxide. In one embodiment in which channel 508 includes tin titanium oxide with an atomic ratio of Sn/(Sn+Ti) of about 0.5 in lieu of indium gallium oxide and is furnace annealed at a temperature of between 550 and 650 and nominally about 600 degrees Celsius, transistor 500 may have a turn-on voltage of approximately 2 volts and a peak incremental mobility of about 0.005 cm$^2$/V s. In other embodiments, a different choice of fabrication process, structure, material selection or other TFT layers, etc., may provide substantially different results for a channel 508 including tin titanium oxide.

Although specific exemplary embodiments have been illustrated and described herein, those of ordinary skill in the art will appreciate that an arrangement calculated to achieve the same techniques can be substituted for the specific exemplary embodiments shown. This disclosure is intended to cover adaptations or variations of the embodiments of the invention. It is to be understood that the above description has been made in an illustrative fashion, and not a restrictive one.

Combination of the above exemplary embodiments, and other embodiments not specifically described herein will be apparent to those of skill in the art upon reviewing the above description. The scope of the various embodiments of the invention includes other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single exemplary embodiment for the purpose of streamlining the disclosure. This method of disclosure is not to be interpreted as reflecting an intention that the embodiments of the invention necessitate more features than are expressly recited in each claim. Rather, as the following claims reflect, inventive subject matter lies in less than all features of a single disclosed exemplary embodiment. Thus, the following claims are hereby incorporated into the Detailed Description, with each claim standing on its own as a separate embodiment.

What is claimed is:

1. A semiconductor device, comprising:
   a drain electrode;
   a source electrode;
   means for a channel to electrically couple the drain electrode and the source electrode, the means comprising an isovalent semiconductor film including indium gallium oxide;
   a gate electrode; and
   a gate dielectric positioned between the gate electrode and the channel.

2. A display device, comprising:
   a plurality of display elements configured to operate collectively to display images, where each of the display elements includes a semiconductor device configured to control light emitted by the display element, the semiconductor device including:
   a drain electrode;
   a source electrode;
   an isovalent semiconductor channel contacting the drain electrode and the source electrode, wherein the channel includes an oxide comprising a combination of isovalent cations selected from within the P block of the Periodic Table;
   a gate electrode; and
   a gate dielectric positioned between the gate electrode and the channel and configured to permit application of an electric field to the channel.

3. A semiconductor device, comprising:
   a drain electrode;
   a source electrode;
   a channel contacting the drain electrode and the source electrode, wherein the channel includes an oxide comprising a combination of isovalent cations selected from within the D block and the P block of the Periodic Table;
   a gate electrode; and
   a gate dielectric positioned between the gate electrode and the channel;
   wherein the combination comprises indium gallium oxide and wherein the indium gallium oxide has an atomic ratio of In/(In+Ga) of greater than about 0.5.

4. A semiconductor device, comprising:
   a drain electrode;
   a source electrode;
   a channel contacting the drain electrode and the source electrode, wherein the channel includes an oxide comprising a combination of isovalent cations selected from within the D block and the P block of the Periodic Table;
   a gate electrode; and a gate dielectric positioned between the gate electrode and the channel;
wherein the combination is selected from a group consisting of:
tin titanium oxide;
tin germanium oxide; and
tin titanium germanium oxide.

5. A semiconductor device, comprising:
a drain electrode;
a source electrode;
a channel contacting the drain electrode and the source electrode, wherein the channel includes an oxide comprising a combination of isovalent cahions selected from within the D block and the P block of the Periodic Table;
a gate electrode; and
a gate dielectric positioned between the gate electrode and the channel, wherein the combination comprises tin oxide and a second $4^+$ cation selected from within the D block and the P block of the Periodic Table.

6. The semiconductor device of claim 5, wherein the combination is selected from a group consisting of:
tin titanium oxide;
tin germanium oxide; and
tin titanium germanium oxide.

7. A semiconductor device, comprising:
a drain electrode;
a source electrode;
an isovalent semiconductor channel contacting the drain electrode and the source electrode, wherein the channel includes an oxide-comprising a combination of isovalent cations selected from within the D block and the P block of the Periodic Table and wherein the combination comprises indium gallium oxide;
a gate electrode; and
a gate dielectric positioned between the gate electrode and the channel.

8. The semiconductor device of claim 7, wherein the channel has a peak incremental channel mobility of at least about 40 cm$^2$/V s with a turn-on voltage greater than or equal to about −15 volts.

9. The semiconductor device of claim 7, wherein the channel has a peak incremental channel mobility of at least about 2 cm$^2$/V s and a turn-on voltage of between about −5 volts and +5 volts.

10. The semiconductor device of claim 7, wherein the indium gallium oxide is sputter deposited.

11. The semiconductor device of claim 7, wherein the indium gallium oxide has an atomic ratio of In/(In+Ga) of greater than about 0.5.

12. The semiconductor device of claim 7, wherein the indium gallium oxide has an atomic ratio of In/(In+Ga) in a range of about 0.1 to about 0.5.

13. The semiconductor device of claim 7, wherein the indium gallium oxide has an atomic ratio of In/(In+Ga) of about 0.9.

14. The semiconductor device of claim 7, wherein the indium gallium oxide has an atomic ratio of In/(In+Ga) in a range of about 0.25 to about 0.35.

15. The semiconductor device of claim 7, wherein the indium gallium oxide has an atomic ratio of In(In+Ga) in a range of about 0.05 to about 0.95.

16. A semiconductor device, comprising:
a drain electrode;
a source electrode;
an isovalent semiconductor channel contacting the drain electrode and the source electrode, wherein the channel includes an oxide-comprising a combination of isovalent cations selected from within the P block of the Periodic Table;
a gate electrode; and
a gate dielectric positioned between the gate electrode and the channel.

17. The semiconductor device of claim 16, wherein the channel includes one of an amorphous form, a single-phase crystalline form, and a mixed- phase crystalline form.

18. The semiconductor device of claim 16, wherein at least one of the drain electrode, the source electrode, the channel, the gate electrode, and the gate dielectric are substantially transparent.

19. The semiconductor device of claim 16, wherein the channel is substantially transparent.

20. The semiconductor device of claim 16, wherein the combination comprises tin oxide and a second $4^+$ cation selected from within the D block and the P block of the Periodic Table.

21. The semiconductor device of claim 16, wherein the combination is selected from a group consisting of:
tin titanium oxide;
tin germanium oxide; and
tin titanium germanium oxide.

22. The semiconductor device of claim 16, wherein the combination comprises indium gallium oxide.

23. The semiconductor device of claim 22, wherein the channel has a peak incremental channel mobility of at least about 40 cm$^2$/V s with a turn-on voltage greater than or equal to about −15 volts.

24. The semiconductor device of claim 22, wherein the channel has a peak incremental channel mobility of at least about 2 cm$^2$/V s and a turn-on voltage of between about −5 volts and +5 volts.

25. The semiconductor device of claim 22, wherein the indium gallium oxide is sputter deposited.

26. The semiconductor device of claim 22, wherein the indium gallium oxide has an atomic ratio of In/(In+Ga) of greater than about 0.5.

27. The semiconductor device of claim 22, wherein the indium gallium oxide has an atomic ratio of In/(In+Ga) in a range of about 0.1 to about 0.5.

28. The semiconductor device of claim 22, wherein the indium gallium oxide has an atomic ratio of In/(In+Ga) of about 0.9.

29. The semiconductor device of claim 22, wherein the indium gallium oxide has an atomic ratio of In/(In+Ga) in a range of about 0.25 to about 0.35.

30. The semiconductor device of claim 22, wherein the indium gallium oxide has an atomic ratio of In/(In+Ga) in a range of about 0.05 to about 0.95.

* * * * *

UNITED STATES PATENT AND TRADEMARK OFFICE
CERTIFICATE OF CORRECTION

PATENT NO. : 7,462,862 B2  Page 1 of 1
APPLICATION NO. : 11/257935
DATED : December 9, 2008
INVENTOR(S) : Randy L. Hoffman et al.

It is certified that error appears in the above-identified patent and that said Letters Patent is hereby corrected as shown below:

In column 8, line 6, delete "14" and insert -- 1-4 --, therefor.

In column 8, line 24, delete "alkenyl groups," and insert -- alkynyl groups, --, therefor.

In column 12, line 42, delete "gate-tb-source" and insert -- gate-to-source --, therefor.

In column 15, line 13, in Claim 5, delete "cahions" and insert -- cations --, therefor.

In column 16, line 2, in Claim 15, delete "In(In+Ga)" and insert -- In/(In+Ga) --, therefor.

In column 16, line 17, in Claim 17, delete "mixed- phase" and insert -- mixed-phase --, therefor.

In column 16, line 56, in Claim 29, delete "0.25to" and insert -- 0.25 to --, therefor.

Signed and Sealed this

Twenty-first Day of July, 2009

JOHN DOLL
*Acting Director of the United States Patent and Trademark Office*